United States Patent [19]
Reineck et al.

[11] Patent Number: 5,962,071
[45] Date of Patent: Oct. 5, 1999

[54] DIAMOND COATED BODY AND METHOD OF ITS PRODUCTION

[75] Inventors: Ingrid Reineck, Huddinge; Maria Nordin, Uppsala, both of Sweden

[73] Assignee: Sanvik AB, Stockholm, Sweden

[21] Appl. No.: 09/131,699

[22] Filed: Aug. 10, 1998

Related U.S. Application Data

[62] Division of application No. 08/777,735, Dec. 20, 1996, Pat. No. 5,858,539.

[30] Foreign Application Priority Data

Dec. 22, 1995 [SE] Sweden .................................. 9504624

[51] Int. Cl.$^6$ .................................................. C23C 16/00
[52] U.S. Cl. ............................ 427/249; 427/307; 427/309
[58] Field of Search ..................................... 427/249, 307, 427/309

[56] References Cited

U.S. PATENT DOCUMENTS

| | | |
|---|---|---|
| 4,731,296 | 3/1988 | Kikuchi et al. . |
| 5,071,708 | 12/1991 | Komaki et al. . |
| 5,164,051 | 11/1992 | Komacki et al. . |
| 5,391,422 | 2/1995 | Omori et al. . |
| 5,435,815 | 7/1995 | Ikegaya et al. . |

FOREIGN PATENT DOCUMENTS

| | | |
|---|---|---|
| 464012 | 6/1991 | European Pat. Off. . |
| 61-162770 | 6/1989 | Japan . |
| 62-283697 | 11/1990 | Japan . |

OTHER PUBLICATIONS

I. Reineck, M.E. Sjöstrand, J. Karner, M. Pedrazzini, "HCDCA Diamond–Coated Cutting Tools", Diamond and Related Materials 5, 1996, pp. 819–824.

H. Liu and D.S. Dandy, "Studies on Nucleation Process in Diamond CVD: An Overview of Receipt Developments", Diamond and Related Materials 4, 1995, pp. 1173–1188.

B. Lux and R. Haubner, "Nucleation and Growth of Low-Pressing Diamond", *Diamond and Diamond–like Films and Coatings*, ed. R.E. Clausing et al., 1991, Plenum Press, New York, pp. 579–609.

Patent Abstracts of Japan, vol. 14, No. 261, C–725, abstract of JP A,2–73975 (Toshiba Tungaloy Co Ltd), Mar.13, 1990 (13.03.90).

Patent Abstracts of Japan, vol. 14, No. 522, C–778, abstract of JP A,2–217472 (Idemitsu Petrochem Co Ltd), Aug. 30, 1990 (30.08.90).

English Translation of JP 62–202897.

*Primary Examiner*—Archene Turner
*Attorney, Agent, or Firm*—Burns, Doane, Swecker & Mathis, L.L.P.

[57] ABSTRACT

There is now provided a body coated with at least one diamond layer on a substrate of cemented carbide or cermets. The substrate is before the diamond coating process provided with spotwise occurring particles containing an element either being any of W, Ta, Ti, Mo Cr, V, Nb, Mg, Ca, Na, K or, preferably, any of B, Si, S, Al or P. These particles are dispersed at a density giving an average distance between two particles of 20 $\mu$m or less, preferably 5 $\mu$m or less.

8 Claims, 2 Drawing Sheets

DIAMOND COATED BODY AND METHOD OF ITS PRODUCTION

This application is a divisional of application Ser. No. 8/777,735, filed Dec. 20, 1996 now U.S. Pat. No. 5,858,539.

BACKGROUND OF THE INVENTION

The present invention relates to a diamond coated body with good adherence of the diamond layer and a high resistance to wear. In particular, the presently claimed invention relates to a cutting tool for cutting Al-alloys containing, e.g., Si and Cu as alloying elements and the like.

The production of thin layers of diamond directly from the gas phase by CVD or PVD technique is of great interest for the coating of cutting tools, drill bits, knives, etc. Gas phase deposition of diamond at useful deposition rates has been the subject for numerous researchers and a number of methods have evolved, all of which are plasma CVD methods.

The commercialization of diamond coated cutting tools has involved several years of research efforts, where the main problem has been achieving sufficient diamond layer adhesion onto the tool substrate material in a large-scale production method in order to make diamond coated cutting tools competitive from an economical point of view. At this stage, these problems have been generally solved and diamond coated cutting tools are produced and sold, see, I. Reineck, M. E. Sjostrand, J. Karner, M. Pedrazzini, "HCDCA Diamond-Coated Cutting Tools", Diamond and Related Materials 5, 1996, pages 819–824. Having reached this level of development, further focus on production cost related issues is of vital importance.

The substrates of interest for diamond layers in cutting applications include cemented carbides and ceramics such as SiAlON and $Si_3N_4$ and the deposition of diamond on these categories of substrates is well-known in the art. A standard method for achieving good diamond adhesion on cemented carbide substrates is to use diamond particles suspended in an ultrasonic bath wherein the tools substrates to be coated are treated prior to diamond deposition in order to scratch the tool surfaces to enhance the nucleation density. A high nucleation density is, however, not sufficient for achieving a good diamond layer adhesion—other parameters, such as control of the binder phase activity, in particular, that of cobalt, in a surface region is also important. Much work has been devoted to the enhancement of nucleation density for diamond growth, see, e.g., page 1173 of H. Liu and D. S. Dandy, "Studies on Nucleation Process in Diamond CVD: An Overview of Receipt Developments", Diamond and Related Materials 4, 1995, pages 1173–1188, for a review.

In B. Lux and R. Haubner, "Nucleation and Growth of Low-Pressing Diamond", *Diamond and Diamond-like Films and Coatings*, ed. R. E. Clausing et al., 1991, Plenum Press, New York, pages 579–609, polishing with $Al_2O_3$ (1 $\mu$m) is said not to enhance the nucleation density while this effect is obtained with diamond grits.

In U.S. Pat. No. 5,164,051, electrolytic polishing of cemented carbide, optionally combined with subsequent scratching with diamond, cBN, $Al_2O_3$ or SiC is described. Diamond is the preferred scratching agent. The indication for good diamond layer adhesion is measured by means of a Rockwell indentation test where the layers are said to withstand a load of 5–25 kg without flaking.

OBJECTS AND SUMMARY OF THE INVENTION

It is an object of this invention to avoid or alleviate the problems of the prior art.

It is further an object of this invention to provide a diamond coated body where the diamond layer adheres well and has a high resistance to wear.

In one aspect of the invention there is provided a body of cemented carbide or cermets coated with at least one diamond layer in which between said body and diamond layer are particles containing at least one element taken from the group consisting of W, Ta, Ti, Mo, Cr, V, Nb, Mg, Ca, Na, K, B, Si, S, Al, P and mixtures thereof, said particles being dispersed at an average distance between two particles of 10 $\mu$m or less.

In another aspect of the invention there is provided a method for producing a diamond coated body comprising treating the body to obtain a suitable surface region depleted of cobalt, treating the bodies in an ultrasonic bath containing particles containing at least one element taken from the group consisting of W, Ta, Ti, Mo, Cr, V, Nb, Al, Mg, Ca, Na, K, B, Si, S, P and mixtures thereof in a concentration of 2–50 g/l for about 30–60 minutes to produce a body having particles of an average size of either less than 5 $\mu$m or between 7–20 $\mu$m on the surface and then coating said bodies with diamond by plasma-CVD technique.

DETAILED DESCRIPTION OF THE PREFERRED EMBODIMENTS OF THE INVENTION

It is surprising to find that the flaking resistance as well as the wear resistance of a diamond layer deposited on a cemented carbide or ceramic body, in particular, a cutting tool insert, can be obtained to a level at least as good as for diamond layers deposited onto tool bodies prepared by ultrasonic pretreatment with diamond particles. This is achieved through a combination of ultrasonic pretreatment with particles consisting of, e.g., $B_4C$, $Al_2O_3$ or SiC, and the removal of binder material, e.g., cobalt, in a surface region of the tool substrate. In addition, the substrate surface should be prepared as to have either a certain surface roughness or to have pores in a surface region. Using particles other than diamond for the predeposition preparation is favorable from the view of production costs.

Figure 1:
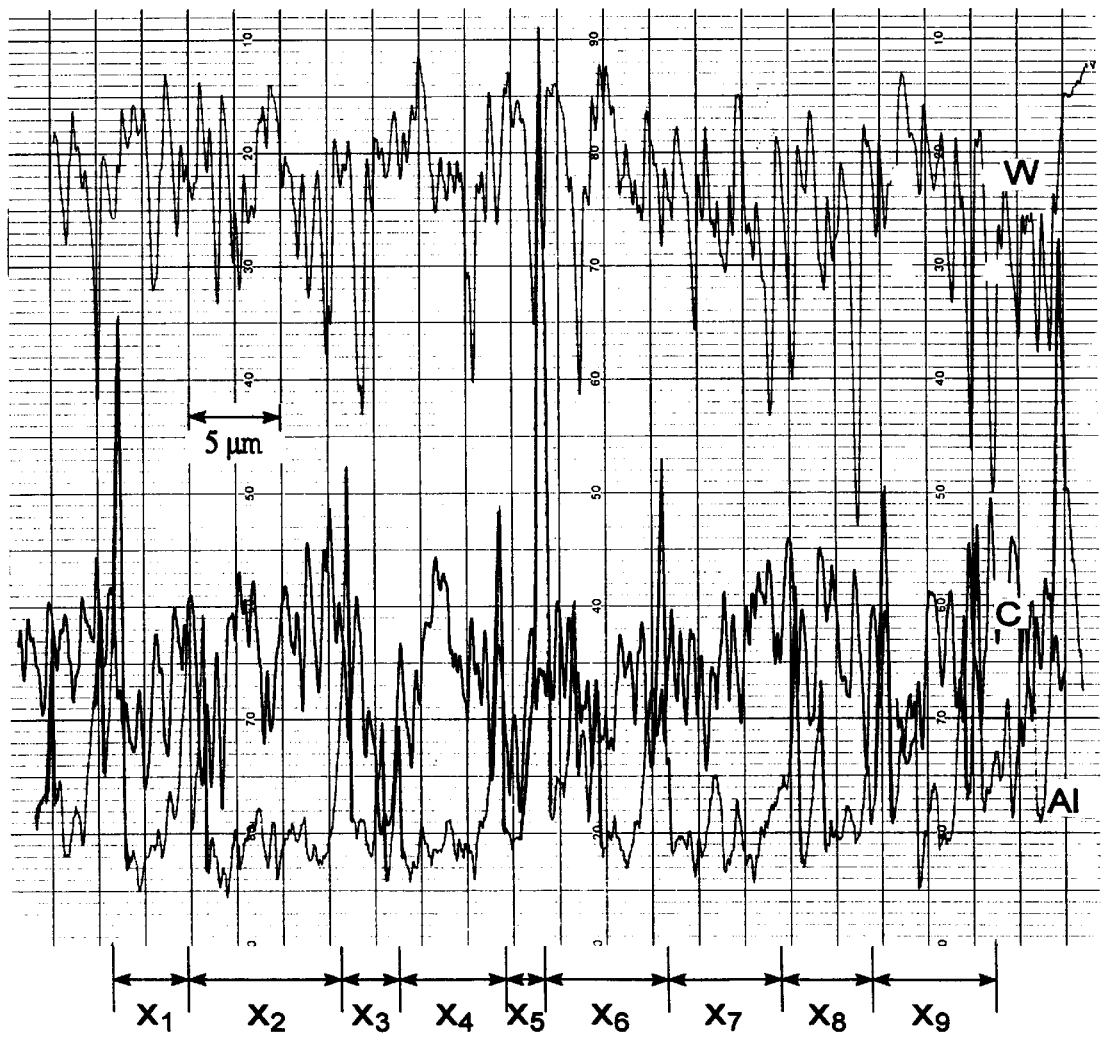
FIG. 1 is an analysis obtained by electron probe microanalyzer of the surface of a body of the present invention after pretreatment.
Figure 2:
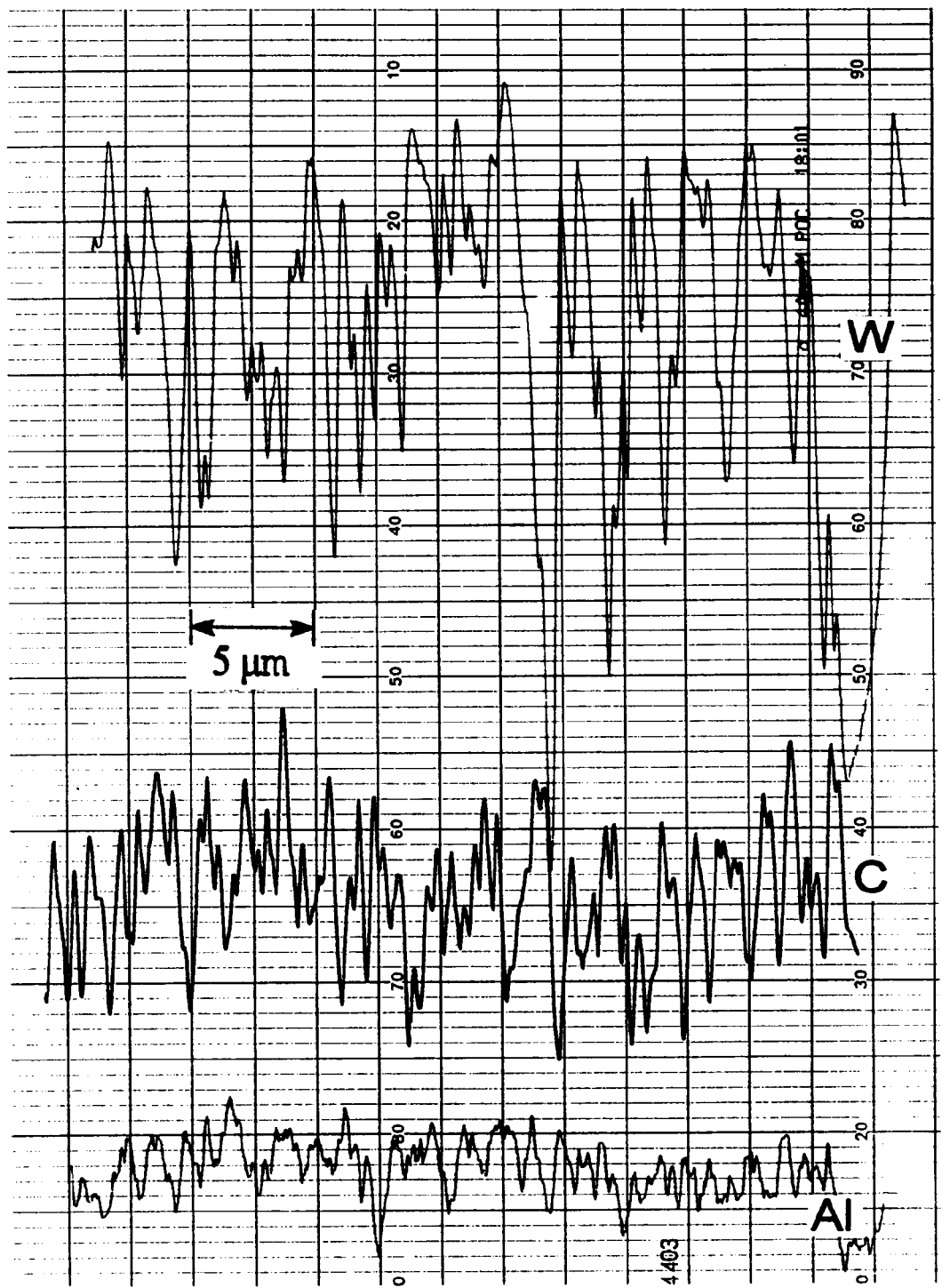
FIG. 2 is an analysis obtained by electron probe microanalyzer of the surface of a body which has been conventionally prepared without pretreatment.

According to the presently claimed invention, the particles provided by the pretreatment can be stuck onto the substrate surface as can be seen by analyzing the surface in an electron probe microanalyzer, see, FIG. 1. The distribution of Al-enriched particles should be compared to that of a substrate surface that is not treated according to the presently claimed invention as shown in FIG. 2.

According to the presently claimed invention, there is now provided a body coated with at least one diamond layer. The surface of the body being in contact with the diamond layer is enriched with particles containing at least 20 weight % of B, Al and/or Si, such as carbides, oxides or nitrides of these, e.g., $B_4C$, BN, SiC or $Al_2O_3$, preferably Al-containing particles. Particles containing S and/or P can also be used as well as metal-containing particles where the metal is at least one of W, Cr, Mo, Ta, Ti, Nb, V, Mg, Ca, Na or K.

The average size of the particles is less than 5 $\mu$m, preferably less than 2 $\mu$m, and most preferably less than 0.5

μm. Alternatively, the average size of the particles is 7–20 μm, preferably 10–15 μm. In another alternative, a combination of small, <0.5 μm, and large particles, 10–15 μm, is present, using at least 25% of each kind.

The particle distribution is such that the average distance $x_m$ between two particles as analyzed by electron microprobe analysis is less than 10 μm, preferably less than 5 μm, where $x_m = \Sigma x_i/n$ where $x_i$ are the individual distances between the nearest neighbors of particles as shown in FIG. 1 and n is the number of such pairs, n being >5.

The surface roughness of the body before the particles are attached is $1<R_a<20$ μm, preferably $1<R_a<10$ μm. In an alternative embodiment, with a surface roughness of $R_a<1$ μm, there are provided pores in a surface region of depth <10 μm, preferably <5 μm. The size of the pores is 0.5–5 μm, preferably 0.5–2 μm.

The bodies according to the presently claimed invention include cemented carbides and cermets. Preferably, a cemented carbide body is depleted in the surface zone with respect to cobalt. This can, for example, be done by partly carburizing an eta phase-containing body as disclosed in U.S. Ser. No. 08/214,157 (our reference: 024000-807).

According to the presently claimed invention, there is also provided a method of preparing bodies suited for coating with diamond layers showing good adhesion. The bodies are first treated in order to get a surface roughening or creation of pores and depletion of cobalt, either through a sintering process which roughens the surface, or by etching the binder material to create pores in the surface region. Such methods are well-known in the art. Subsequently, the bodies are treated in an ultrasonic bath containing the above-mentioned particles in a concentration of 2–50 g/l in water, oil or other suitable liquid for about 30–60 minutes. The average size of the particles used (and therefore deposited on the surface) is less than 5 μm, preferably less than 2 μm, and most preferably less than 0.5 μm. As an alternative method of treatment, particles of average size, 7–20 μm, preferably 10–15 μm, are used. In a preferred method, the bodies are treated using particles of average size, 10–15 μm, and of average size, less than 0.5 μm, either simultaneously in one treatment, using at least 25% of each kind, or separately in two consecutive treatments.

As an alternative method of providing the particles to the surfaces of the substrates, a solution containing the desired elements can be used out of which particles are precipitated.

After the body is treated to provide the particle-containing surface, a diamond layer is applied by conventional plasma-CVD techniques known to the skilled artisan.

The presently claimed invention has been described with reference to a diamond layer in direct contact with a cemented carbide or cermet body. It is obvious that the invention can be applied also to the case when one or more intermediate layers are present between the body and the diamond layer.

The presently claimed invention can be applied to diamond coated cutting tools, tools for rock drilling and wear parts as well as to other superhard layers, such as cBN layers deposited by CVD or PVD methods.

The invention is additionally illustrated in connection with the following Examples which are to be considered as illustrative of the present invention. It should be understood, however, that the invention is not limited to the specific details of the Examples.

EXAMPLE 1

Six WC-6% Co cemented carbide inserts with a cobalt depleted surface zone and a surface roughness of $R_a=2.0$ μm were first treated in an ultrasonic bath containing 1 g $B_4C$-powder of a grain size of 5–15 μm in 200 ml of oil as a suspending medium. The treatment time was 30 minutes. The inserts were subsequently ultrasonically treated in a suspension consisting of $Al_2O_3$ powder of a grain size of <0.5 μm at a concentration of 1 g per 200 ml of oil for another 30 minutes. The inserts were then cleaned in alcohol for 30 minutes in the ultrasonic bath.

The $Al_2O_3$-$B_4C$ pretreated inserts were analyzed in an electron microprobe with respect to Al. Particles containing Al were found to exist at an average distance of 4 μm between each two particles.

A set of reference WC-6% Co inserts were ultrasonically pretreated in diamond grit powder of a grain size of 0–2 μm suspended in oil. The treatment time, as well as the cleaning procedure, was the same as for the above-mentioned inserts.

Subsequently, both types of inserts were diamond coated to a layer thickness of 7 μm using microwave plasma assisted CVD. The grain size of the layer was about 5 μm.

The inserts were subjected to a turning flaking test in an Al-18% Cu alloy using the following cutting data:

v=300 m/min
f=0.1 mm
a=1 mm
wet cutting

The diamond coated set of inserts pretreated according to the invention lasted 6 minutes in this test, until a wear zone of a width of 0.1 mm was formed, compared to the result for the set of insert pretreated with diamond grit suspension which lasts only 4 minutes. Apart from the improvement in tool life, the benefit of using a cheaper pretreatment agent compared to the diamond grit is demonstrated.

EXAMPLE 2

Six WC-4% Co inserts with a cobalt depleted surface zone and a porous surface layer of 5 μm with a pore size of 1 μm, were pretreated in an ultrasonic suspension containing $B_4C$ powder of a grain size distribution of 5–0 μm. The treatment time was 30 minutes. The inserts were then ultrasonically cleaned in alcohol for 30 minutes. A set of reference inserts was prepared in accordance with the reference inserts of Example 1. The inserts were coated with a 10 μm thick diamond layer using a DC arc plasma CVD method.

Prior to diamond coating, the $B_4C$ treated inserts were analyzed in an electron microprobe with respect to boron. Boron-containing particles were found with an average distance of 4 μm between each two individual particles.

The inserts were subjected to a milling flaking test in an Al-9% Si alloy using the following cutting data:

v=2000 m/min
f=0.5 mm/tooth
a=1 mm
wet cutting

The diamond coated set of inserts pretreated according to the presently claimed invention lasted 100 passes in this test without any visible damage. This result was also achieved for the diamond grit treated set of inserts. Hence, a similar performance can be achieved by using a $B_4C$ treatment instead of the more expensive diamond grit treatment.

EXAMPLE 3

Six WC-4% Co inserts with a cobalt depleted surface zone and a surface roughness of $R_a=5$ μm were treated in an ultrasonic bath containing 1 g $B_4C$ of a grit size of 10 μm in 200 ml of oil for 30 minutes. The inserts were subsequently treated in an aqueous $Al_2(SO_4)_3$ solution (10%) for 5 minutes. An alkaline solution of 2% NaOH was then added to the $Al_2(SO_4)_3$ solution, still being stirred in the ultrasonic bath. The inserts were treated in this bath for another 25 minutes. Then the inserts were ultrasonically cleaned in alcohol for 15 minutes. Reference inserts were prepared in accordance with the reference inserts of Example 1. All inserts were diamond coated in a DC plasma activated CVD process to a diamond layer thickness of 10 μm.

Prior to diamond coating the $Al_2(SO_4)_3$-treated inserts were analyzed in an electron microprobe with respect to aluminum. Aluminum-containing particles were found at an average distance of 5 μm between each two individual particles.

The inserts were subjected to a turning flaking test in an Al-18% Cu alloy using the following cutting data:

v=700 m/min f=0.05 mm a=−1 mm wet cutting

The diamond coated set of inserts pretreated according to the presently claimed invention lasted 4 minutes in this test compared to the result for the set of inserts pretreated with diamond grit suspension, which was 2 minutes. Again, an improvement in tool life is demonstrated, together with the benefit of using a cheaper pretreatment agent compared to the diamond grit powder.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method for producing a diamond layered body comprising treating the body to obtain a suitable surface region depleted of cobalt, treating the bodies in an ultrasonic bath containing particles containing at least one element taken from the group consisting of W, Ta, Ti, Mo, Cr, V, Nb, Al, Mg, Ca, Na, K, B, Si, S, P and mixtures thereof in a concentration of 2–50 g/l for about 30–60 minutes to produce a body having particles of an average size of either less than 5 μm, or between 7–20 μm on the surface and then coating said bodies with diamond by plasma-CVD technique.

2. The method of claim 1 wherein the bodies are treated using particles of both an average size of 10–15 μm, and of an average size less than 0.5 μm.

3. The method of claim 2 wherein each average size particles are present in an amount of at least 25%.

4. The method of claim 2 wherein the both said particles are present in one treating step.

5. The method of claim 2 wherein the body is treated in two consecutive treating steps, each said step containing one of said average-size particles.

6. The method of claim 1 wherein the body is treated in a solution containing the desired elements out of which solution the desired particles precipitate.

7. The method of claim 1 wherein the average size of the particles is less than 2 μm.

8. The method of claim 1 wherein the average size of the particles is between 10 and 15 μm.

* * * * *